(12) United States Patent
Lei et al.

(10) Patent No.: US 10,176,042 B2
(45) Date of Patent: *Jan. 8, 2019

(54) USING RELIABILITY INFORMATION FROM MULTIPLE STORAGE UNITS AND A PARITY STORAGE UNIT TO RECOVER DATA FOR A FAILED ONE OF THE STORAGE UNITS

(71) Applicant: INTEL CORPORATION, Santa Clara, CA (US)

(72) Inventors: Andre Lei, Burnaby (CA); Scott Nelson, Vancouver (CA); Zion S. Kwok, Burnaby (CA); Ravi H. Motwani, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 83 days.

This patent is subject to a terminal disclaimer.

(21) Appl. No.: 15/438,655

(22) Filed: Feb. 21, 2017

(65) Prior Publication Data

US 2017/0300380 A1    Oct. 19, 2017

Related U.S. Application Data

(63) Continuation of application No. 14/499,078, filed on Sep. 26, 2014, now Pat. No. 9,588,841.

(51) Int. Cl.
*G06F 11/10* (2006.01)
*G11C 29/52* (2006.01)
(Continued)

(52) U.S. Cl.
CPC ...... *G06F 11/1068* (2013.01); *G06F 11/1012* (2013.01); *G11C 5/143* (2013.01); *G11C 29/52* (2013.01); *H03M 13/1105* (2013.01)

(58) Field of Classification Search
CPC .............................. G06F 11/10; G06F 11/1068
(Continued)

(56) References Cited

U.S. PATENT DOCUMENTS

| 8,473,780 B2 * | 6/2013 | Shalvi ................. G06F 11/1092 711/162 |
| 2012/0159285 A1 * | 6/2012 | Motwani ............. G06F 11/1012 714/767 |

(Continued)

FOREIGN PATENT DOCUMENTS

| CN | 103827833 A | 5/2014 |
| WO | 2013016168 A2 | 1/2013 |

OTHER PUBLICATIONS

Intel Corporation, "Intel Announces Third-Generation SSD: Intel Solid-State Drive 320 Series", [online], Mar. 28, 2011, [Retrieved on Sep. 22, 2014], retrieved from the Internet at , 4 pp.

(Continued)

*Primary Examiner* — Kamini B Patel
(74) *Attorney, Agent, or Firm* — Compass IP Law PC

(57) ABSTRACT

Provided are a method, system, and apparatus using reliability information from multiple storage units and a parity storage unit to recover data for a failed one of the storage units. A decoding operation of the codeword is performed in each of the storage units comprising the data storage units other than the target data storage unit and the parity storage unit to produce reliability information. In response to the decoding operation failing for at least one additional failed storage unit comprising the data and/or parity storage units other than the target data storage unit that failed to decode, reliability information is obtained for the data portion of the at least one additional failed storage unit. The reliability information obtained from the storage units other than the target data storage unit is used to produce corrected data for the data unit in the target data storage unit.

28 Claims, 8 Drawing Sheets

(51) Int. Cl.
*H03M 13/11* (2006.01)
*G11C 5/14* (2006.01)

(58) Field of Classification Search
USPC .......................................................... 714/6.1
See application file for complete search history.

(56) References Cited

U.S. PATENT DOCUMENTS

| | | | | |
|---|---|---|---|---|
| 2012/0216095 | A1* | 8/2012 | Ha | G06F 11/1004 714/758 |
| 2012/0233521 | A1* | 9/2012 | Kwok | H03M 13/2906 714/758 |
| 2012/0240007 | A1* | 9/2012 | Barndt | H03M 13/1108 714/758 |
| 2013/0024605 | A1* | 1/2013 | Sharon | G06F 11/1072 711/103 |
| 2013/0318395 | A1* | 11/2013 | Kalavade | G06F 11/1412 714/15 |
| 2014/0208075 | A1* | 7/2014 | McCormick, Jr. | G06F 9/3017 712/207 |
| 2015/0095736 | A1* | 4/2015 | Leem | G06F 11/1012 714/758 |
| 2016/0092300 | A1* | 3/2016 | Lei | G06F 11/1068 714/764 |

OTHER PUBLICATIONS

International Preliminary Report on Patentability, PCT/US2015/046809, dated Apr. 6, 2017, 10 pages.
International Search Report and Written Opinion for International Application No. PCT/US2015/046809, dated Feb. 19, 2016, 13 pp. [77.301PCT (ISR & WO)].
Motwani, R., et al., "Low Density Parity Check (LDPC) Codes and the Need for Stronger ECC", Aug. 2011, 18 pp.
Xie, N., et al., "Improving Error Correction in NAND with Dominant Error Pattern Detection", Intel Technology Journal, vol. 17, Issue 1, 2013, 8 pp.
Chinese Translation of P.R. China State Intellectual Property Office First Office Action for Patent Application No. 201580045594.0, dated Jun. 22, 2018, 9 pages.

* cited by examiner

USING RELIABILITY INFORMATION FROM MULTIPLE STORAGE UNITS AND A PARITY STORAGE UNIT TO RECOVER DATA FOR A FAILED ONE OF THE STORAGE UNITS

This application is a continuation of earlier filed U.S. patent application Ser. No. 14/499,078 entitled "USING RELIABILITY INFORMATION FROM MULTIPLE STORAGE UNITS AND A PARITY STORAGE UNIT TO RECOVER DATA FOR A FAILED ONE OF THE STORAGE UNITS", filed on Sep. 26, 2014, the entire teachings of which are incorporated herein by this reference.

TECHNICAL FIELD

Embodiments described herein generally relate to error recovery operations with respect to non-volatile storage devices, such as flash storage devices, including NAND flash memory.

BACKGROUND

A solid state drive (SSD) may be comprised of multiple NAND dies. Data may be encoded and stored as codewords, such as Low Density Parity Check (LDPC) codewords, in each of the data dies and one parity die may maintain parity (XOR) information that may be used to recover the user data in the codeword if the codeword cannot be decoded on one of the NAND dies. If one of the NAND dies has bit errors resulting in a failure of the decode operation when decoding a codeword from the NAND die, the parity information for the codeword in the parity NAND die may be XOR'd with the data for the NAND dies other than the failing NAND die failing the decode to recover the data.

The above XOR protection scheme in the parity NAND die comprises a parity check code which permits a single erasure to be corrected. If an Error Correction Code (ECC) failure occurs on one codeword, the system can rebuild the lost data from the data on the NAND dies not experiencing failure of the decode operation. This form of recovery relies on hard information from successful ECC decodes in the other dies. If more than one NAND die experiences ECC decode fails, then the data on the target failed NAND die to recover cannot be recovered through an XOR parity correction operation.

There is a need in the art for improved techniques for recovering data when one or more of the NAND dies being used for the XOR recovery also fails to decode.

BRIEF DESCRIPTION OF THE DRAWINGS

Embodiments are described by way of example, with reference to the accompanying drawings, which are not drawn to scale, in which like reference numerals refer to similar elements.

DESCRIPTION OF EMBODIMENTS

Current XOR parity recovery techniques using parity data on a parity disk or NAND die are not capable of recovering data for a storage unit having error correction bit errors from a group of storage units covered by the XOR parity code if multiple storage units or NAND dies in the group have bit errors resulting in an error correction code (ECC) failure.

Described embodiments provide techniques to allow recovery of data from a storage unit experiencing bit errors that is in a group of storage units for which XOR parity data is maintained. Described embodiments provide operations in a memory controller to decode codewords from data storage units and the parity storage unit, such as NAND dies, other than the data storage unit having the bit errors to repair, referred to herein as the failed data storage unit, from which data is being recovered. Reliability information is obtained from the storage units (data and parity) other than the target data storage unit through a decoding operation or reading the reliability information from the data storage units when decoding of the storage unit fails. The reliability information from the storage units other than the target data storage unit is accumulated as accumulated reliability information, which is then combined with reliability information obtained by performing a second type decoding operation on the target data storage unit. In described embodiments some of the data for the target data storage unit may be recovered even if other of the storage units also fail during the recovery attempt.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage devices electronic assemblies. Embodiments include both devices and methods for forming electronic assemblies.

Figure 1:
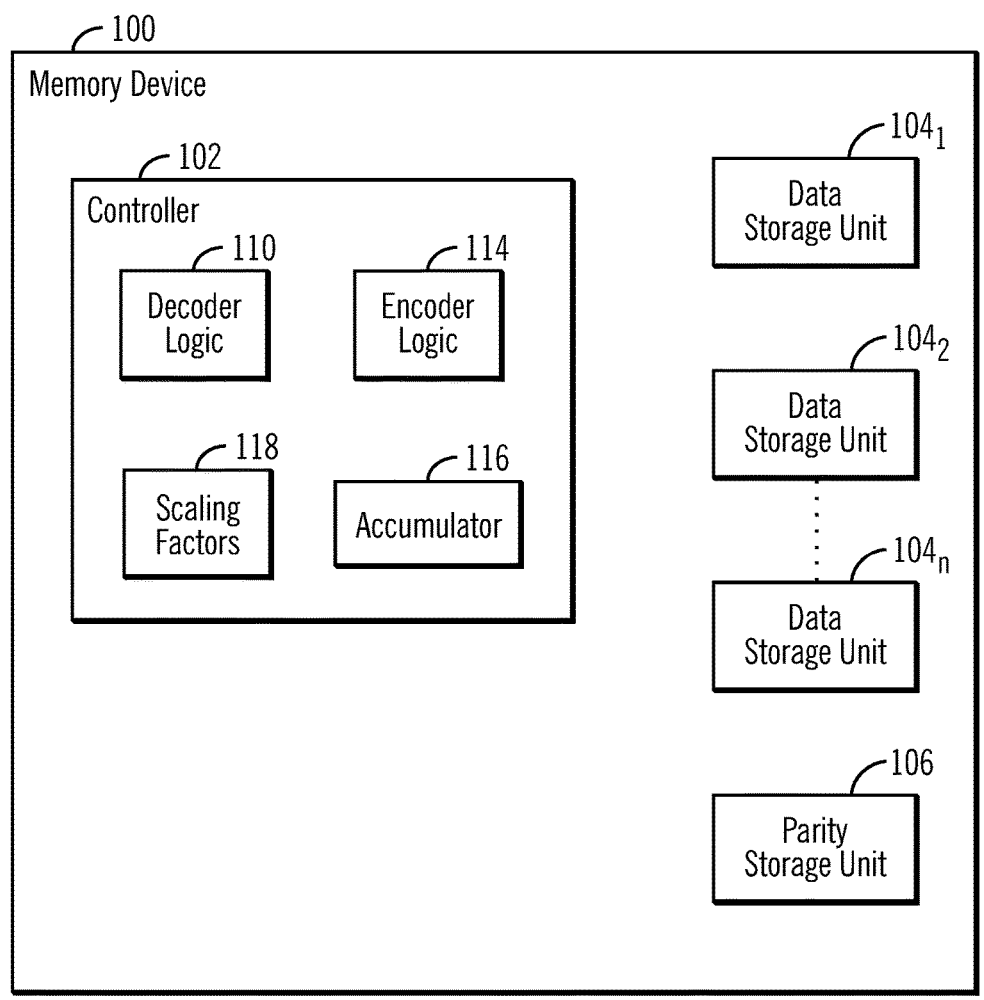
FIG. 1 illustrates an embodiment of a storage device.

FIG. 1 illustrates an embodiment of a storage device 100, such as a solid state drive (SSD), including a non-volatile memory controller 102 to perform read, write and error recovery (also known as read retry) operations with respect to a memory storage array comprising data storage units $104_1$, $104_2$ ... $104_n$ and a parity storage unit 106 having XOR parity data to perform parity error recovery if one the data storage units $104_1$, $104_2$ ... $104_n$ fails.

In one embodiment, the storage units $104_1$, $104_2$ ... $104_n$, 106 may comprise electrically erasable and non-volatile memory cells, such as flash storage devices. For instance, storage units $104_1$, $104_2$ ... $104_n$, 106 may comprise NAND dies of flash memory cells. In one embodiment, the NAND dies may comprise a multilevel cell (MLC) NAND flash memory that in each cell records two bit values, a lower bit value and an upper bit value. Alternatively, the NAND dies may comprise single level cell (SLC) memories or three bit per cell (TLC) memories. The storage units $104_1, 104_2 \ldots 104_n$, 106 may also comprise, but not limited to, MLC NAND flash memory, ferroelectric random-access memory (FeTRAM), nanowire-based non-volatile memory, three-dimensional (3D) crosspoint memory such as phase change memory (PCM), memory that incorporates memristor technology, Magnetoresistive random-access memory (MRAM), Spin Transfer Torque (STT)-MRAM, a single level cell (SLC) Flash memory and other electrically erasable programmable read only memory (EEPROM) type devices.

The controller 102 includes decoder logic 110 to decode codewords in the storage units $104_1, 104_2 \ldots 104_n$, 106. The controller 102 also includes an encoder 114 to encode data to write to memory cells of the storage units $104_1, 104_2 \ldots 104_n$, 106 in a manner to maximize the probability of the data being accurately recovered. The encoder 114 and decoder 110 may use Low Density Parity Check (LDPC) encoding and decoding algorithms known in the art to encode and decode codewords into the storage units $104_1, 104_2 \ldots 104_n$, 106.

Figure 2:
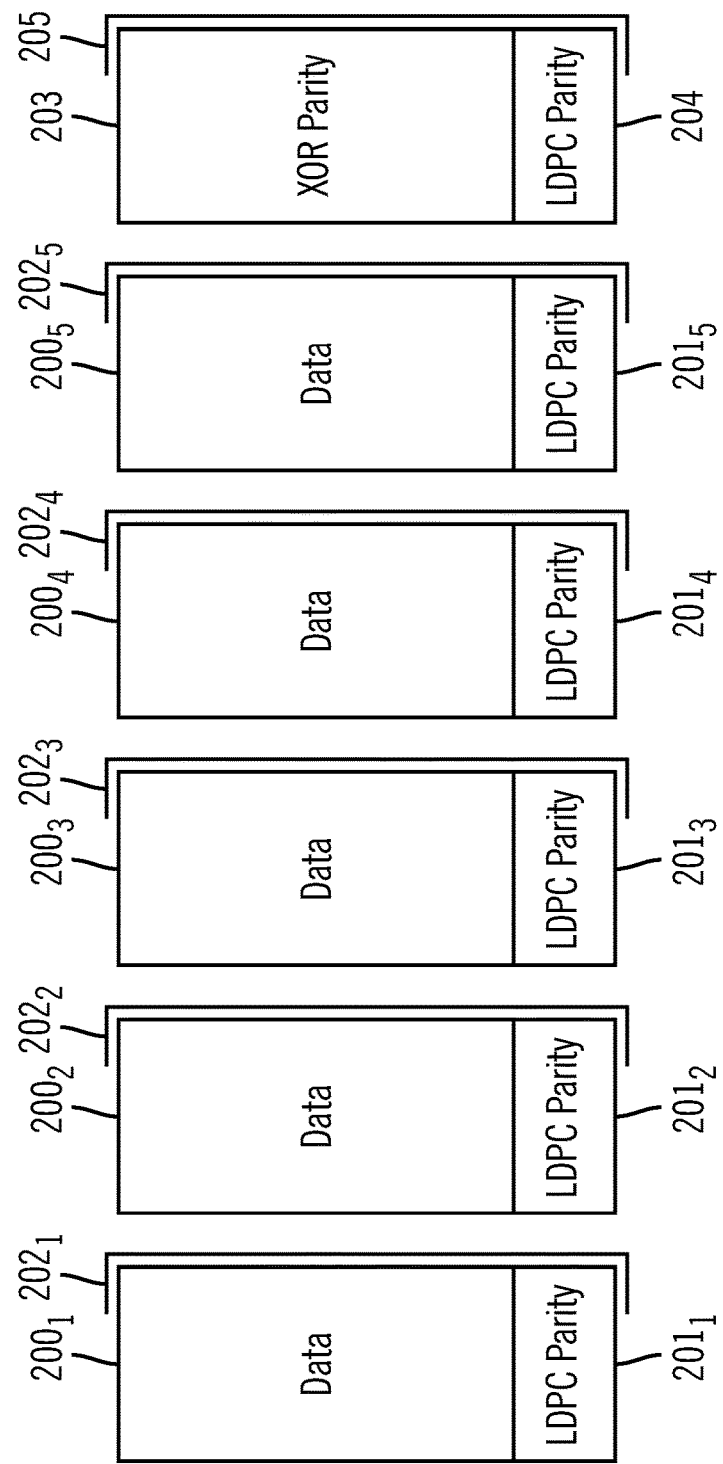
FIG. 2 illustrates an embodiment of storage of data, parity information, and decoding information on dies.

FIG. 2 illustrates an example of how data may be stored on the data storage units $104_1, 104_2 \ldots 104_n$, 106. FIG. 2 shows data units $200_1, 200_2 \ldots 200_5$ in five storage units, e.g., NAND dies, and a parity portion $201_1, 201_2 \ldots 201_5$, e.g., LDPC parity data, that when combined with the data unit $200_1, 200_2 \ldots 200_n$ forms an encoded codeword $202_1, 202_2 \ldots 202_n$, such as an LDPC codeword. FIG. 2 further shows an instance of the parity data 203 for the codewords $202_1, 202_2 \ldots 202_n$ stored in the parity storage unit 106. The XOR parity data 203 also has a parity codeword portion 204, such that the combination of the XOR parity data 203 and parity codeword portion 204 forms an encoded codeword 205 for the XOR parity data, such as an LDPC codeword. There may be XOR parity 203 for each bit of data in the data units $200_1, 200_2 \ldots 200_5$. The XOR parity data 203 may be used to recover the data $200_1, 200_2 \ldots 200_n$ if the data from one of the codewords $202_1, 202_2 \ldots 202_n$, cannot be successfully decoded. Further, if the contents of 205 is a linear block code, such as LDPC, and the same linear block code is used in $202_1, 202_2 \ldots 202_5$, then the contents of LDPC Parity 204 can also be equal to the XOR of each bit in $201_1, 201_2 \ldots 201_5$.

In one embodiment, the storage units $104_1, 104_2 \ldots 104_n$, 106 may comprise separate physical devices, such as NAND dies. In further embodiments, a data storage unit storing or XOR parity storage unit may be spread out across multiple physical devices, such as NAND dies and occupy portions of multiple NAND dies. In certain embodiments, the parity storage unit 106 may be spread across multiple NAND dies, using different dies to store the XOR parity information for different portions of the memory. For instance, if there are five NAND dies A, B, C, D, for address range 0-50, A, B, C, D are data and E is XOR parity and for address range 51-100, A is XOR parity and B, C, D, E are data. In this example, there are two NAND dies used for parity for different XOR stripes. Further, the XOR stripe does not need to take storage units from the same address in each die.

The controller 102 further includes an accumulator 116 in which reliability information obtained for the storage units $104_1, 104_2 \ldots 104_n$, 106 other than the target data storage unit being recovered is accumulated. The bit reliability information may comprise soft information, such as Log-Likelihood Ratios (LLRs). In one embodiment, the accumulator 116 is initialized and then the reliability information from the data storage units $104_1, 104_2 \ldots 104_n$ other than the target data storage unit $104_f$ are serially accumulated into the accumulator 116. In this way, storage space is conserved because not all the decode output are separately buffered, but instead a single accumulated value is stored in the accumulator 116.

Scaling factors 118 provide a value used to weight the output of the accumulator 116, accumulated reliability information, before combining with the reliability information the decoder logic 110 produces from the target data storage unit $104_f$. The scaling factor 118 may provide different values depending on the number of decode errors or decoding fail operations by the data storage units $104_1, 104_2 \ldots 104_n$, 106, other than the target data storage unit $104_f$ whose data is to be recovered. The scaling factor provides a lower weighting as the number of decode fails by the storage units $104_1, 104_2 \ldots 104_n$, 106 being used to recover the data from the target data storage unit increases. In certain embodiments, there may be multiple sets of scaling factors sets of weighting values to use in multiple iterations if the recovered data for the target data storage unit does not converge to a valid ECC codeword.

Figure 3:
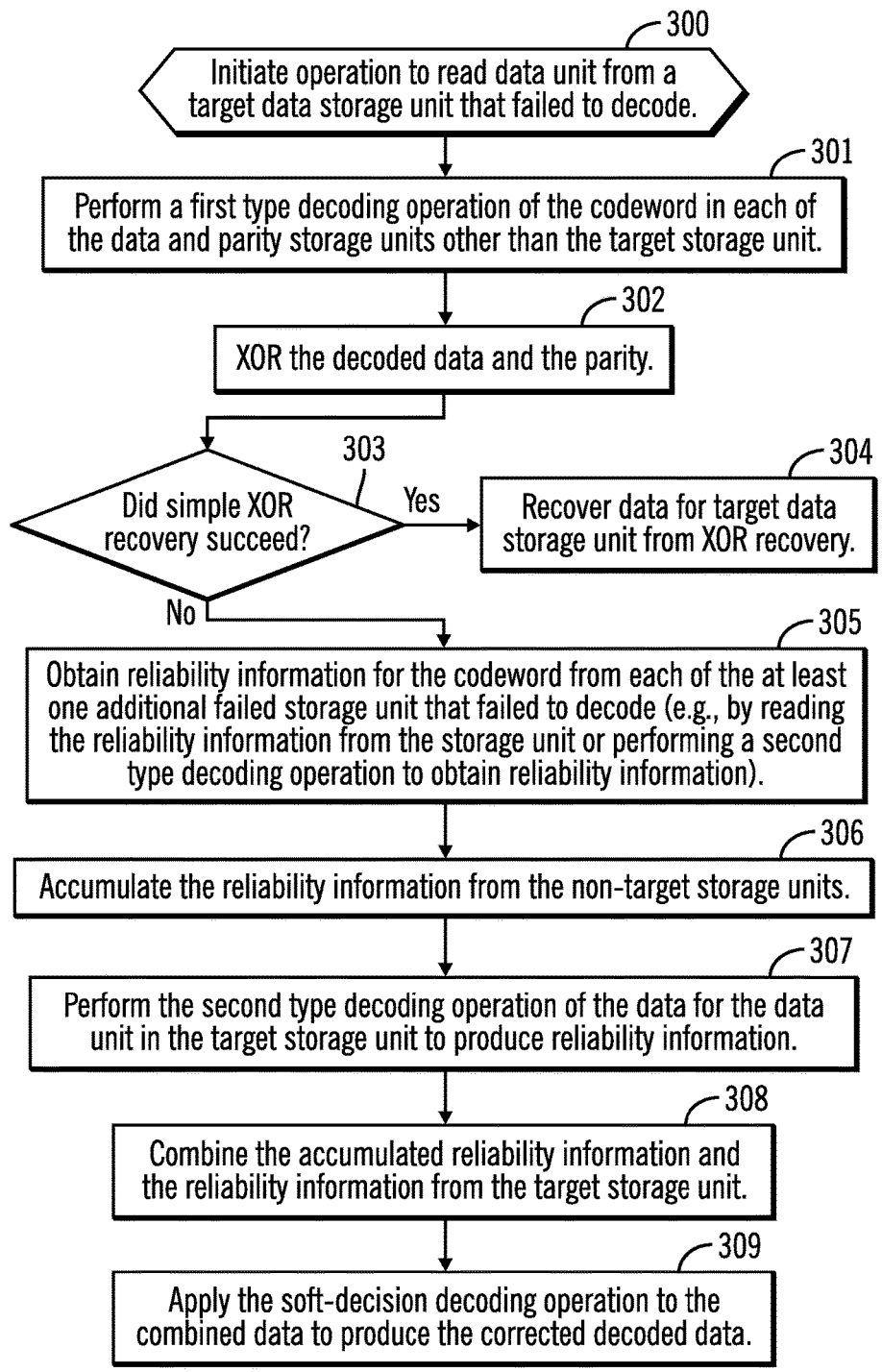
FIG. 3 illustrates an embodiment of operations to perform error recovery for a failed data storage unit.

FIG. 3 illustrates an embodiment of operations performed by the components of the memory controller 102 to recover a codeword that could not be decoded from the target data storage unit $104_f$ that failed to decode. Upon initiating (at block 300) an operation to recover the data unit $200_f$ from the target data storage unit $104_f$, the decoder logic 110 performs (at block 301) a first type decoding operation of the codewords $202_1, 202_2 \ldots 202_n$, 205 in each of the storage units $104_1, 104_2 \ldots 104_n$, 106 other than the target data storage unit $104_f$ to produce decoded data units $200_1, 200_2 \ldots 200_n$, 203. The decoder logic 110 may perform a full LDPC min-sum iterative decoding of the read values from bits of the data unit as part of a full read retry reflow decoding. A full LDPC iterative decode means decoding up to the maximum number of LDPC iterations configured for the system.

The decoded data and parity data is then XOR'd (at block 302). If (at block 303) the XOR recovery operation succeeds, then the data $200_f$ for the target data storage unit $104_f$ is recovered. If (at block 303) the simple XOR recovery failed if some of the first type decoding operations failed, then the decoder logic 110 obtains (at block 305) reliability information for the codeword from each of the at least one additional target data storage unit. The decoder logic 110 may obtain the soft information, such as reliability information, by reading the reliability information from the storage units $104_1, 104_2 \ldots 104_n$, 106. Alternatively, the decoder logic 110 may obtain the soft information by performing a second type decoding operation of the data for the data unit at each of the at least one additional failed storage unit to produce second type decode output for each of the at least one additional failed storage unit. This second type decoding operation may comprise a partial LDPC decoding with a limited number of iterations, which may produce second decoding output having some low confidence values for some bits in the codeword. Although the partial second decoding may produce output having a low confidence value, the second partial decode improves upon the reliability of the initial soft read since it can fix those bit errors that are very likely to be wrong. The first type decoding operation, e.g., full LDPC decoding, is performed first to try to decode the codeword. If the first type decoding passes, then the successfully corrected codeword bits are considered to have very high reliability values; else if the first type decoding fails, then the reliability information needs to be obtained which indicates a confidence value, e.g., bit reliability metric, LLR value, etc.

The accumulator 116 accumulates (at block 306) the reliability information from the non-target storage units (parity and data) to produce accumulated reliability information. In one embodiment, the reliability information, e.g., reliability metric values (LLRs), from the storage units $104_1$, $104_2 \ldots 104_n$, 106 other than the target data storage unit $104_f$ may be combined using a "soft XOR" operation. The soft XOR operation may be equivalent to the check node update in a belief propagation algorithm, such as a min-sum algorithm, scaled min-sum, offset min-sum, scaled offset min-sum, sum of products algorithm, etc. When combining, the reliability information for codewords that successfully decoded would indicate success.

The controller 102 obtains reliability information for the codeword $202_f$ from the target data storage unit $104_f$. In one embodiment, the controller 102 reads codeword $202_f$ from data storage unit $104_f$ to obtain reliability information. In one embodiment, the decoder logic 110 performs (at block 307) the second type decoding, e.g., partial LDPC decoding, of the codeword $202_f$ in the target data storage unit $104_f$ to produce reliability information. Alternatively, the reliability information could be obtained from a read of the target storage unit.

The accumulated reliability information (soft XOR output) is combined (at block 308) with the reliability information from the target storage unit, such as by using a weighted sum operation. The weighted sum operation may be equivalent to the variable node update in a belief propagation algorithm, such as a min-sum algorithm, scaled min-sum, offset min-sum, scaled offset min-sum, sum of products algorithm, etc. An embodiment of a weighted sum operation is provided in equation (1) below:

$$\text{weighted\_sum}(A_j, B_j) = +\text{scaling\_factor} * B_j \quad (1)$$

where $A_j$ is the reliability information for one bit j of the LDPC codeword $202_f$, that is obtained through reading the target storage unit or through a second type of decoding; and $B_j$ comprises the accumulated reliability information currently stored in the accumulator 116 for the corresponding bit j. Alternatively, where ECC decoding algorithms such as non-binary LDPC are used, the reliability may be determined for each symbol j, where a symbol may represent an arbitrary plurality of bits in a codeword.

The decoder logic 110 may then apply (at block 309) an LDPC soft-decision decoding of the combined decode output to produce recovered data $200_f$ for the codeword $202_f$ from the target data storage unit $104_f$.

Figure 4A:
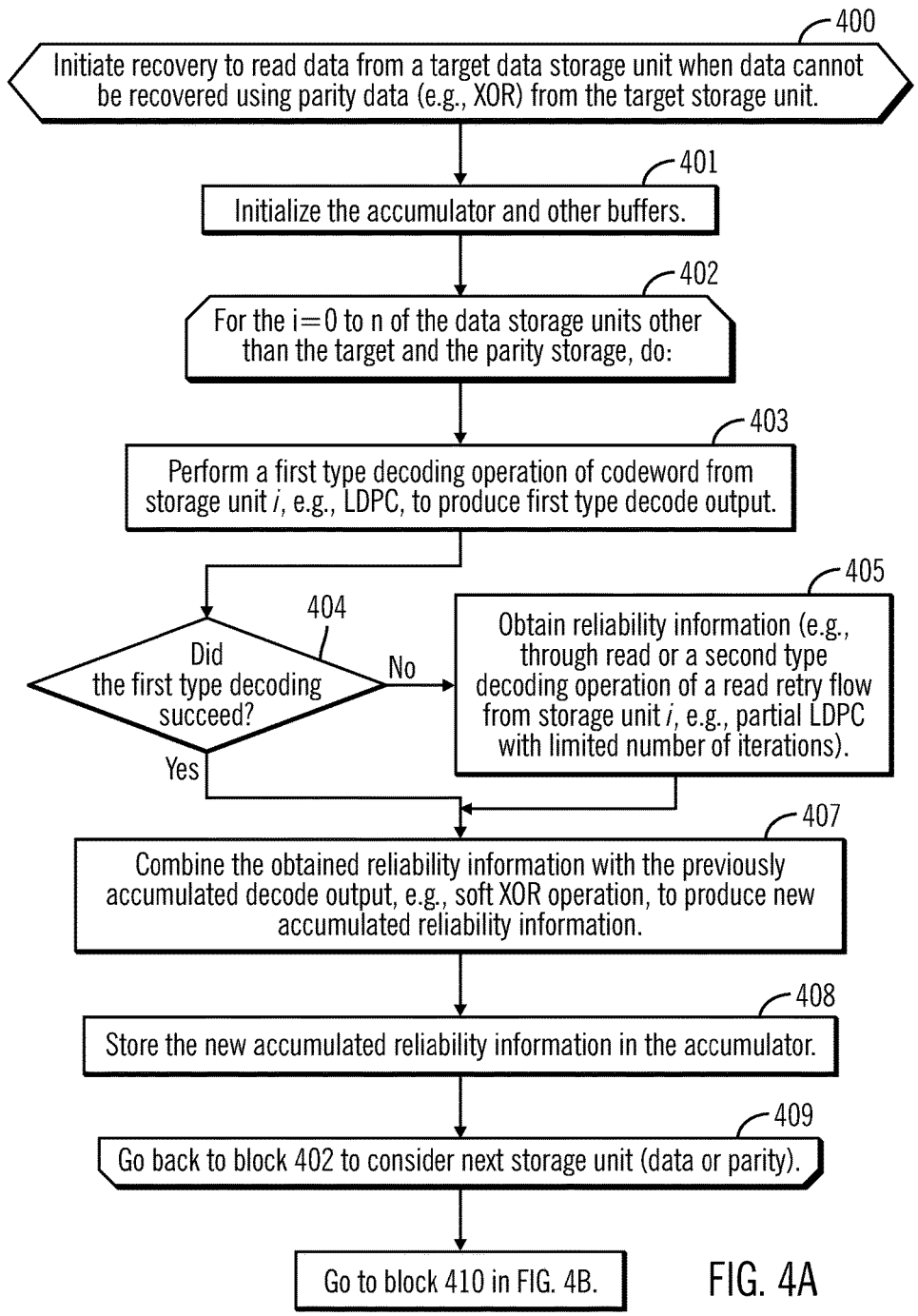
FIGS. 4a, 4b, and 4c illustrate a further embodiment of operations to perform error recovery for a failed data storage unit.
Figure 4B:
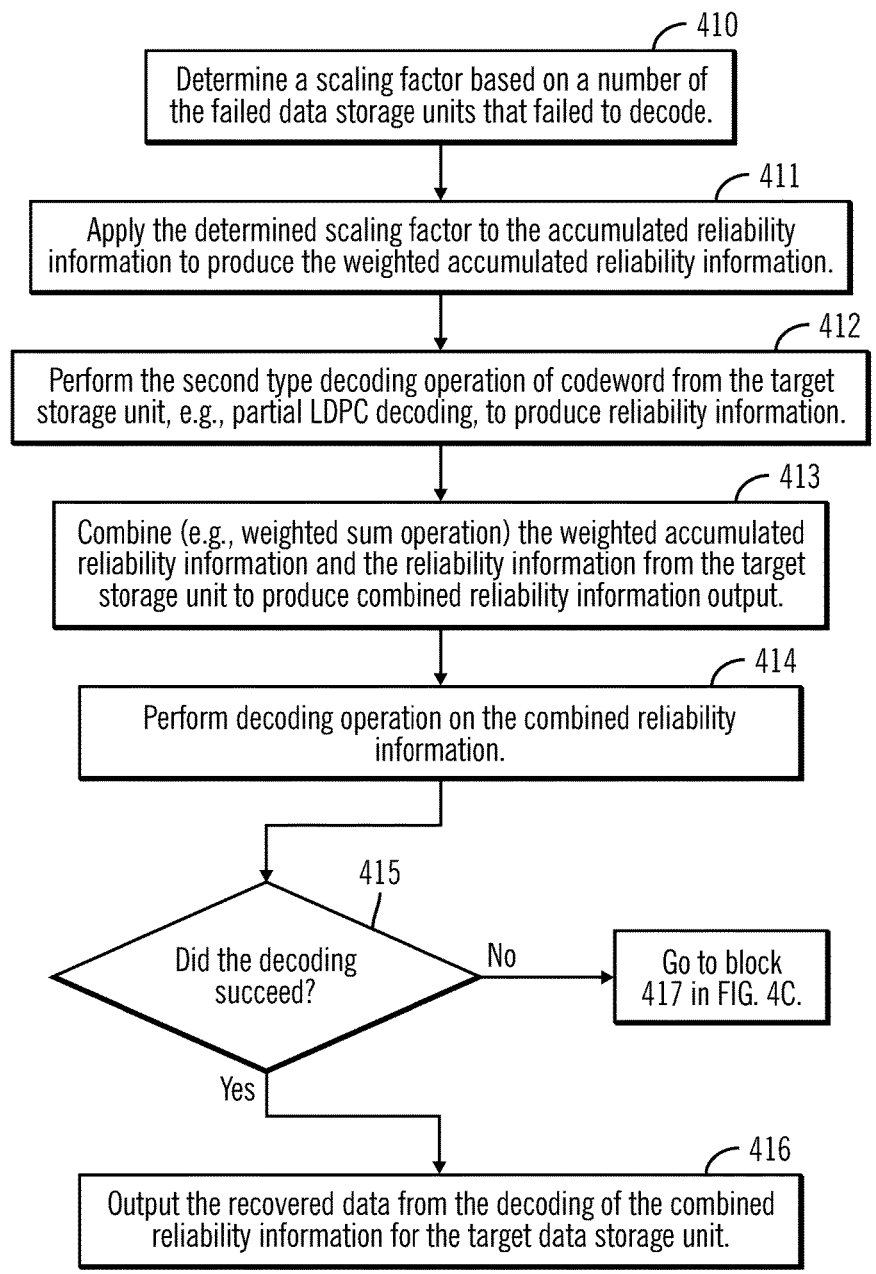
Figure 4C:
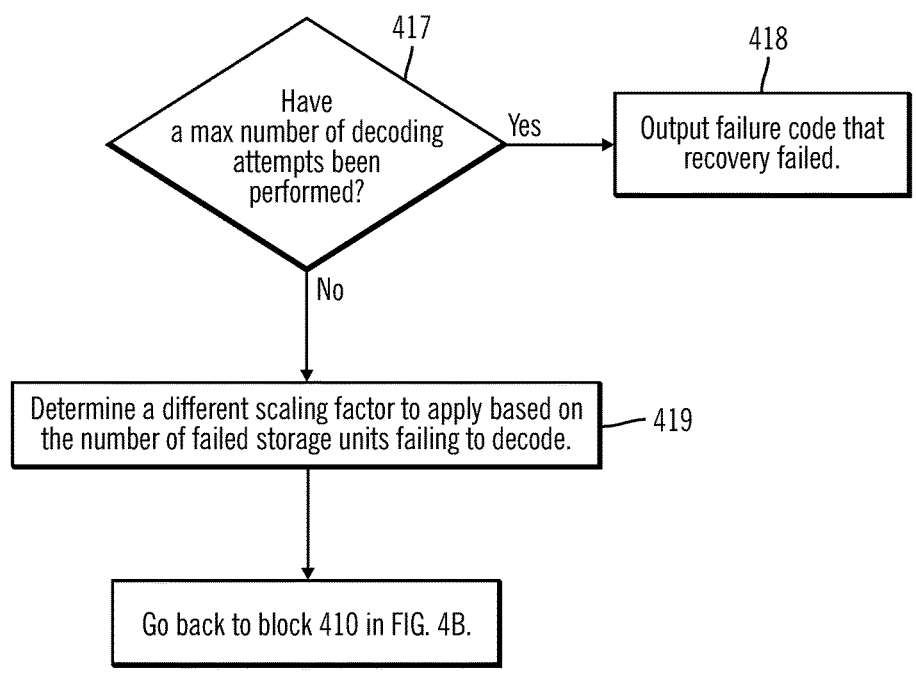

FIGS. 4a, 4b, and 4c illustrate a further embodiment of operations performed by the components of the memory controller 110 to recover data from a failed data storage unit $104_f$. If more than one data storage unit $104_1, 104_2 \ldots 104_n$ fails, i.e., the decode operation fails, then the parity data 203 in the XOR parity storage unit 106 may not be successfully used to recover data $200_1, 200_2 \ldots 200_n$ from a failed data storage unit in an XOR recovery operation. In such case, the decoder logic 110 initiates (at block 400) a recovery operation to recover data from a failed data storage unit $104_f$ and initializes (at block 401) the accumulator 116 and any other used registers or buffers. The decoder logic 110 performs a loop of operations at blocks 402 through 409 for each of the storage units $104_1, 104_2 \ldots 104_n$, 106 other than the target data storage unit $104_f$ and the parity storage unit 106 The operations at blocks 402 through 409 may be performed serially for each of the storage units data storage units $104_1$, $104_2 \ldots 104_n$, 106 other than the target data storage unit $104_f$. The decoder logic 110 performs (at block 403) a first type decoding operation of data read, e.g., hard bit data and soft information, from storage unit i, such as by using LDPC min-sum iterative decoding, to produce a valid codeword.

If (at block 404) the first decoding did not pass, i.e., experienced fail by not converging to a valid value, then the reliability information for the codeword to decode may be obtained (at block 405) through a read to the storage unit i to read the reliability information for the codeword or by performing the second type decoding operation after reading reliability information from the storage unit. In an alternative embodiment, the second type decoding can happen without re-reading the reliability information from the storage unit by taking the originally read data and then when failing the second type decode, extracting the previously read data including the reliability information. If (at block 404) the first type decoding passed, then decode is treated as successful and control proceeds to block 407. The decoder 110 may output different reliability information, e.g., LLR confidence value, for each bit of the decoded data $200_i$.

The accumulator 116 combines (at block 407) the obtained reliability information with the previously accumulated reliability information in the accumulator 116 to produce a new accumulated reliability information in the accumulator 116, which is then stored (at block 408) as a new accumulated reliability information in the accumulator 116. In one embodiment, the obtained reliability information may be combined with the current reliability information in the accumulator 116 using a "soft XOR operation". An embodiment of a soft XOR operation is provided in equation (2) below:

$$\text{soft\_XOR}(A_j, B_j) = \text{sgn}(A_j) * \text{sgn}(B_j) * \min(|A_j|, |B_j|). \quad (2)$$

where $A_j$ is the reliability information for one bit j of the LDPC codeword $202_j$, that is obtained that is obtained through the first type of decoding if the first type decoding is successful, or else that is obtained through reading the storage unit or through a second type of decoding; and $B_j$ comprises the accumulated decode output currently stored in the accumulator 116 for the corresponding bit j. Alternatively, where ECC decoding algorithms such as non-binary LDPC are used, the reliability may be determined for each symbol j, where a symbol may represent an arbitrary plurality of bits in a codeword. The "sgn" operation may comprise a signum function. The newly calculated value is stored as the new accumulated reliability information in the accumulator 116. This value may comprise a bit j reliability value or LLR. The equation (2) reduces the confidence of the data being combined to least confident data. The XOR accumulated decode output is captured by multiplying the signs of the data.

After calculating the accumulated reliability information in the accumulator 116 and, control proceeds to block 410 in FIG. 4b, where a scaling factor is determined based on a number of decoding errors or additional failed storage units $104_1, 104_2 \ldots 104_n$, 106 other than the target data storage unit $104_f$. The scaling factor is applied (at block 411) to the accumulated reliability information from the accumulator 116, which may comprise soft information such as LLRs, to produce the weighted accumulated reliability information, which may be weighted depending on the number of failed data storage units. The decoder logic 110 performs (at block 412) the second type decoding of data for the codeword read from the target data storage unit $104_f$, e.g., partial LDPC decoding, to produce reliability information, which may have a low confidence value. The weighted accumulated reliability information is combined (at block 413) with the reliability information from the target data storage unit $104_f$, such as combined in a weighted sum operation on the LLR values, to produce combined reliability information, which may be represented as a confidence level or reliability metric, e.g., LLR.

The decoder logic 110 then performs (at block 414) a decoding operation, e.g., soft decoding, on the combined reliability information. If (at block 415) the decoding operation succeeded, i.e., converges to a valid LDPC codeword, then the decoder logic 110 outputs (at block 416) decoded data as the recovered data from the target data storage unit $104_f$. If (at block 415) the decoding operation failed, then control proceeds to block 417 in FIG. 4c. If (at block 417) a maximum number of decoding attempts of the decoding operation with respect to the combined reliability information have been performed, then failure is returned (at block 418) indicating the data for the data unit could not be recovered from the target data storage unit $104_f$. If (at block 417) the maximum number of decoding attempts have not been performed, then a new scaling factor 118 is determined (at block 419) based on the number of data storage units failing to decode. Control then proceeds back to block 410 to retry the decoding with the new scaling factor applied to the accumulated reliability information in the accumulator 116.

With the described embodiments, the soft information generated from the accumulator 116 rebuild can reinforce or reduce the confidence of the soft information from the target data storage unit $104_f$. The combining process may utilize scaling of accumulated reliability information before summing with the reliability information of the target data storage unit $104_f$. The combined reliability information is then passed into the decoder logic 110 to decode.

Figure 5:
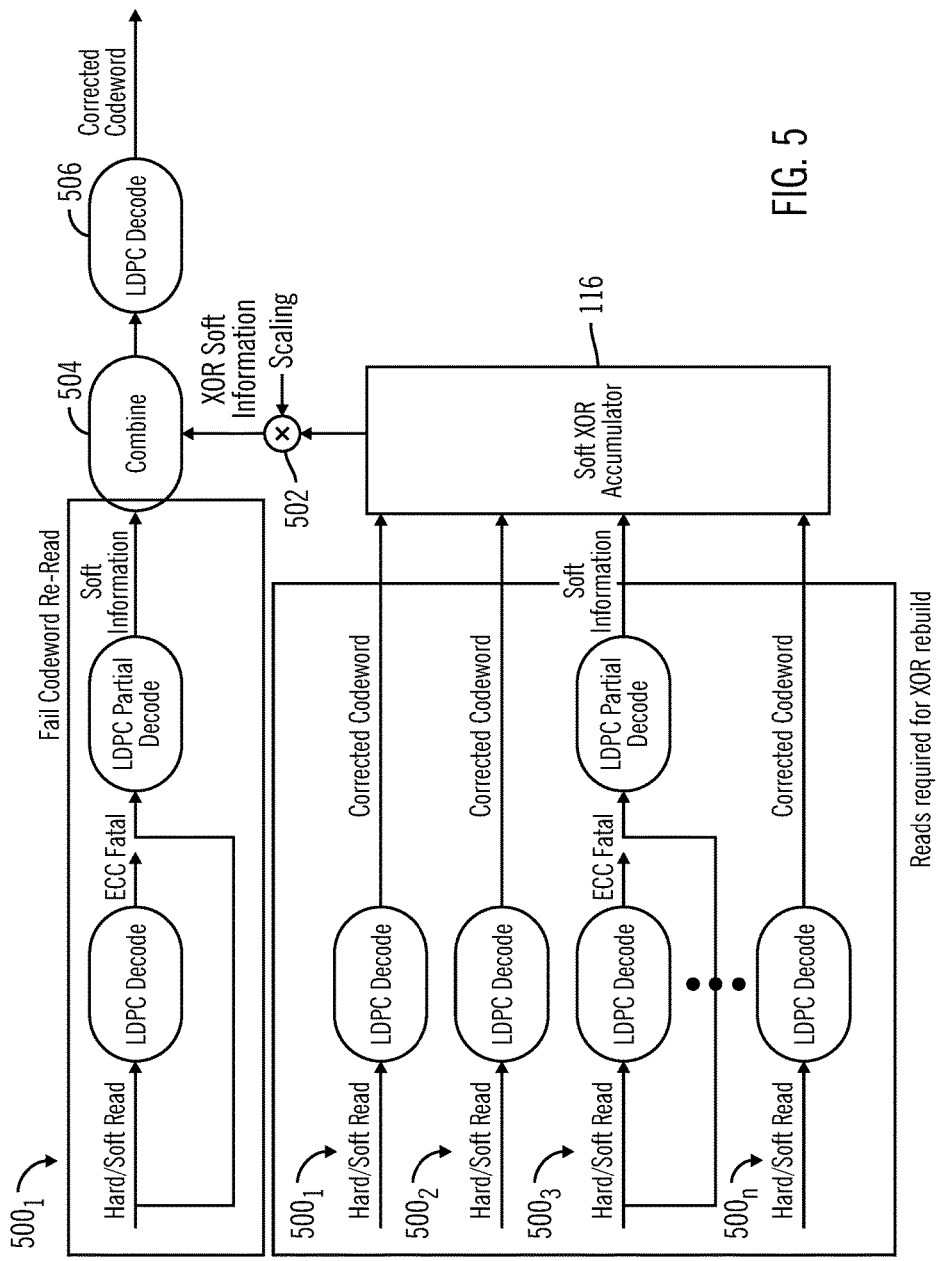
FIG. 5 illustrates an illustration of the flow of decoding operations for error recovery for a failed data storage unit.

FIG. 5 illustrates an embodiment showing the flow of processing according to the embodiment of FIGS. 4a, 4b, 4c. FIG. 5 shows processing flows $500_1, 500_2 \ldots 500_n$ from the storage units $104_1, 104_2 \ldots 104_n$, 106 other than the target data storage unit $104_f$, and processing flow $500_f$ shows the processing flow for the failed data storage unit $104_f$ whose data is being recovered. The flows $500_1, 500_2$, and $500_n$ are able to decode the read data upon the first decoding operation, e.g., a full read-retry flow LDPC coding, resulting in the decoded data. The flow $500_3$ had to resort to obtaining reliability information from the storage unit through a read operation because the first type decoding operation failed. The accumulated reliability information in the accumulator 116 is then subject to scaling 502, and then is combined 504 with reliability information from the target data storage unit obtained with the second type decoding, e.g., partial LDPC decoding, performed on the information from the target data storage unit $104_f$ in the flow $500_f$. The results of combining the accumulated reliability information and the reliability information from the target data storage unit at the combine 504 is subject to a soft decode operation 506 to produce the final corrected data from the target data storage $104_f$. If the final LDPC decode operation 506 fails to decode, then the scaling factors applied at step 502 may be adjusted, and then the combining 504 and LDPC decode 506 are performed again with the newly scaled accumulated decode output.

Described embodiments provide a decoding technique when more than one of the storage units $104_1, 104_2 \ldots 104_n$, 106 have failed decoding, so that the XOR parity information alone with the data in the surviving data storage units cannot be used to recover the data form the target storage unit. With described embodiments, data and parity storage units may be decoded using a first type decoding operation, such as a full LDPC decode. For the storage units that fail the full decode, the reliability metrics may be obtained by reading the storage unit or performing a second type decoding, e.g., partial decoding operation. The reliability information, e.g., LLR values, may then be combined in an accumulator and/or then recombined with the reliability information from the target data storage unit to produce the decoded data, such as soft information, for the target data storage unit that is further decoded to produce the recovered data for the failed data storage unit.

Figure 6:
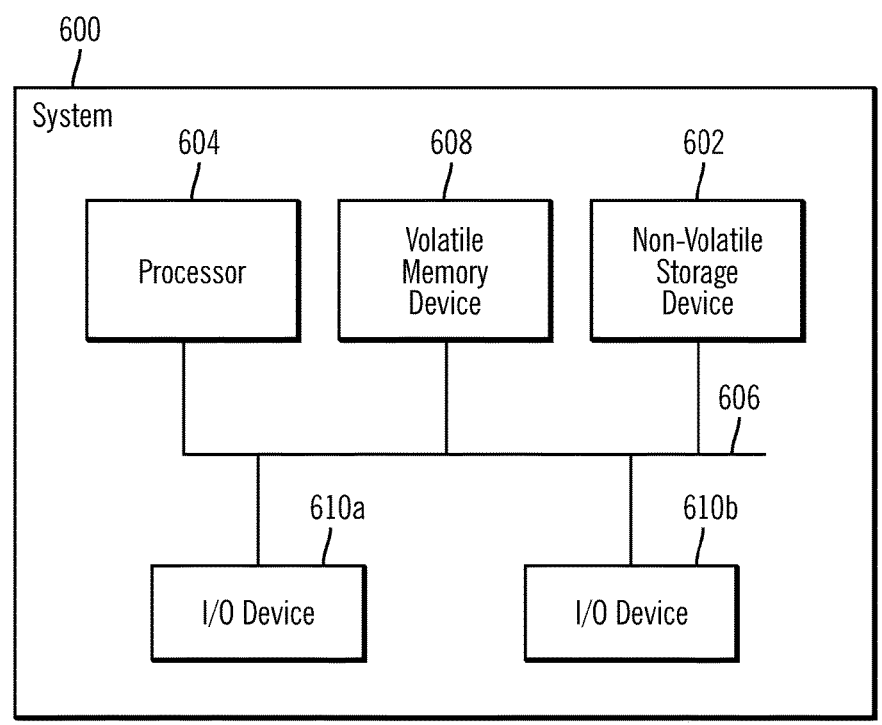
FIG. 6 illustrates a system in which the storage device of claim 1 may be deployed.

FIG. 6 illustrates an embodiment of a system 600 in which a non-volatile storage device 602, such as storage device 100 of FIG. 1, may be deployed. The system includes a processor 604 that communicates over a bus 606 with a volatile memory device 608 in which programs, operands and parameters being executed are cached and the non-volatile storage device 602, in which data and programs may be stored. The processor 600 may also communicate with Input/Output (I/O) devices 610a, 610b, which may comprise input devices, display devices, graphics cards, ports, network interfaces, etc. The non-volatile storage device 602 may be mounted to the system enclosure 600, such as in a storage drive bay, or connected to the system 600 through a port interface or over the network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

The described operations of the memory controller 102 and the logic components 110, 114, 116, 118, and other components, may be implemented as a method, apparatus or computer readable storage medium using standard programming and/or engineering techniques to produce software, firmware, hardware, or any combination thereof. The described operations may be implemented as code or logic maintained in a "computer readable storage medium", which may directly execute the functions or where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The computer readable storage medium may further comprise digital logic implemented in a hardware device (e.g., an integrated circuit chip, a programmable logic device, a Programmable Gate Array (PGA), field-programmable gate array (FPGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals, but includes tangible components. Those skilled in the art will recognize that many modifications may be made to this configuration without departing from the scope of the present invention, and that the article of manufacture may comprise suitable information bearing medium known in the art.

EXAMPLES

The following examples pertain to further embodiments.

Example 1 is an apparatus comprising: an apparatus comprising: a plurality of data storage units, each storing a codeword including a data portion; a parity storage unit storing having XOR parity data for error correction of the data portion in the data storage units; and a controller coupled to the storage units to perform an error recovery operation for data in a target data storage unit comprising one of the data storage units by performing operations comprising: performing a decoding operation of the codeword in each of the storage units comprising the data storage units other than the target data storage unit and the parity storage unit to produce reliability information; in response to the decoding operation failing for at least one additional failed storage unit comprising the data and/or parity storage units other than the target data storage unit that failed to decode, obtaining reliability information for the data portion of the at least one additional failed storage unit; and using the reliability information obtained from the storage units other than the target data storage unit to produce corrected data for the data unit in the target data storage unit.

In Example 2, the subject matter of Example 1 can optionally include that the data storage units and parity storage units each comprise NAND dies forming a solid state drive.

In Example 3, the subject matter of Example 1 and 2 can optionally include that the decoding operation comprises a first type decoding operation, and wherein the operations further comprise: accumulating in an accumulator the reliability information for the storage units other than the target data storage unit to use to produce accumulated reliability information; and performing a second type decoding operation for the data unit in the target data storage unit to produce reliability information; combining the accumulated reliability information from the accumulator with the reliability information from the target data storage unit to produce combined reliability information; and decoding the combined reliability information to produce the corrected data for the target data storage unit.

In Example 4, the subject matter of Examples 1-3 can optionally include that the operations further comprise: weighting the accumulated reliability information by a scaling factor based on a number of decoding errors of the storage units other than the target data storage unit to produce weighted accumulated reliability information, wherein the weighted accumulated reliability information is combined with the reliability information from the target data storage unit to produce the combined reliability information.

In Example 5, the subject matter of Example 1-4 can optionally include that the weighted accumulated reliability information comprises a first weighted accumulated reliability information and wherein the combined reliability information comprises first combined reliability information, and wherein the operations further comprise: decoding the first combined reliability information to produce decoded data for the target data storage unit; in response to the decoded data not successfully decoding, determining a new scaling factor; and weighting the accumulated reliability information by the new scaling factor based to produce a second weighted accumulated reliability information, wherein the second weighted accumulated reliability information is combined with the reliability information from the target data storage unit to produce second combined reliability information.

In Example 6, the subject matter of Examples 1-5 can optionally include that the accumulating the reliability information comprises serially combining the reliability information from each of the storage units other than the target data storage unit with a stored previously accumulated reliability information, wherein the operations further comprise: during each serial iteration, storing a result of the serially combining the reliability information with the previously accumulated reliability information to use as the stored previously accumulated reliability information.

In Example 7, the subject matter of Examples 2-6 can optionally include that the combining comprises applying a soft XOR operation on the reliability information from one of the storage units other than the target data storage unit and the previously accumulated reliability information.

In Example 8, the subject matter of Examples 2-7 can optionally include that the reliability information comprises Log-Likelihood Ratio (LLR) values.

In Example 9, the subject matter of Examples 2-8 can optionally include that the first type decoding comprises applying a low-density parity-check ("LDPC") decoding to produce the reliability information output and wherein the second type decoding comprises a partial LDPC decoding performed by rerunning the LDPC decoding a partial number of decoding attempts to produce reliability information.

In Example 10, the subject matter of Examples 2-9 can optionally include that the obtaining the reliability information when the decoding operation fails for the at least one additional failed storage unit comprises reading the reliability information from the storage unit being decoded.

Example 11 is a method for an error recovery operation for data in a target data storage unit comprising one of a plurality of data storage units storing codewords including data portions, wherein a parity storage unit has XOR parity data for error correction of the data portion in the data storage units, comprising: performing a decoding operation of the codeword in each of the storage units comprising the data storage units other than the target data storage unit and the parity storage unit to produce reliability information; in response to the decoding operation failing for at least one additional failed storage unit comprising the data and/or parity storage units other than the target data storage unit that failed to decode, obtaining reliability information for the data portion of the at least one additional failed storage unit; and using the reliability information obtained from the storage units other than the target data storage unit to produce corrected data for the data unit in the target data storage unit.

In Example 12, the subject matter of example 11 can optionally include that the decoding operation comprises a first type decoding operation, further comprising: accumulating in an accumulator the reliability information for the storage units other than the target data storage unit to use to produce accumulated reliability information; and performing a second type decoding operation for the data unit in the target data storage unit to produce reliability information; combining the accumulated reliability information from the accumulator with the reliability information from the target data storage unit to produce combined reliability information; and decoding the combined reliability information to produce the corrected data for the target data storage unit.

In Example 13, the subject matter of Examples 11-12 can optionally include that the weighting the accumulated reliability information by a scaling factor based on a number of decoding errors of the storage units other than the target data storage unit to produce weighted accumulated reliability information, wherein the weighted accumulated reliability information is combined with the reliability information from the target data storage unit to produce the combined reliability information.

In Example 14, the subject matter of Examples 11-13 can optionally include that the weighted accumulated reliability information comprises a first weighted accumulated reliability information and wherein the combined reliability information comprises first combined reliability information, and wherein the operations further comprise: decoding the first combined reliability information to produce decoded data for the target data storage unit; in response to the decoded data not successfully decoding, determining a new scaling factor; and weighting the accumulated reliability information by the new scaling factor based to produce a second weighted accumulated reliability information, wherein the second weighted accumulated reliability information is combined with the reliability information from the target data storage unit to produce second combined reliability information.

In Example 15, the subject matter of Examples 11-14 can optionally include that the accumulating the reliability information comprises serially combining the reliability information from each of the storage units other than the target data storage unit with a stored previously accumulated reliability information, further comprising: during each serial iteration, storing a result of the serially combining the reliability information with the previously accumulated reliability information to use as the stored previously accumulated reliability information.

In Example 16, the subject matter of Examples 11-15 can optionally include that the combining comprises applying a soft XOR operation on the reliability information from one of the storage units other than the target data storage unit and the previously accumulated reliability information.

In Example 17, the subject matter of Examples 11-16 can optionally include that the first type decoding comprises applying a low-density parity-check ("LDPC") decoding to produce the reliability information output and wherein the second type decoding comprises a partial LDPC decoding performed by rerunning the LDPC decoding a partial number of decoding attempts to produce reliability information.

In Example 18, the subject matter of Examples 12-17 can optionally include that the obtaining the reliability information when the decoding operation fails for the at least one additional failed storage unit comprises reading the reliability information from the storage unit being decoded.

Example 19 is a system comprising: a processor; a memory coupled to the processor; a storage device, wherein data is communicated among the processor, the memory, and the storage device, comprising: a plurality of data storage units, each storing a codeword including a data portion; a parity storage unit storing having XOR parity data for error correction of the data portion in the data storage units; and a controller coupled to the storage units to perform an error recovery operation for data in a target data storage unit comprising one of the data storage units by performing operations comprising: performing a decoding operation of the codeword in each of the storage units comprising the data storage units other than the target data storage unit and the parity storage unit to produce reliability information; in response to the decoding operation failing for at least one additional failed storage unit comprising the data and/or parity storage units other than the target data storage unit that failed to decode, obtaining reliability information for the data portion of the at least one additional failed storage unit; and using the reliability information obtained from the storage units other than the target data storage unit to produce corrected data for the data unit in the target data storage unit.

In Example 20, the subject matter of Example 19 can optionally include that the decoding operation comprises a first type decoding operation, and wherein the operations further comprise: accumulating in an accumulator the reliability information for the storage units other than the target data storage unit to use to produce accumulated reliability information; and performing a second type decoding operation for the data unit in the target data storage unit to produce reliability information; combining the accumulated reliability information from the accumulator with the reliability information from the target data storage unit to produce combined reliability information; and decoding the combined reliability information to produce the corrected data for the target data storage unit.

In Example 21, the subject matter of Examples 19-20 can optionally include that the operations further comprise: weighting the accumulated reliability information by a scaling factor based on a number of decoding errors of the storage units other than the target data storage unit to produce weighted accumulated reliability information, wherein the weighted accumulated reliability information is combined with the reliability information from the target data storage unit to produce the combined reliability information.

In Example 22, the subject matter of Examples 19-21 can optionally include that the weighted accumulated reliability information comprises a first weighted accumulated reliability information and wherein the combined reliability information comprises first combined reliability information, and wherein the operations further comprise: decoding the first combined reliability information to produce decoded data for the target data storage unit; in response to the decoded data not successfully decoding, determining a new scaling factor; and weighting the accumulated reliability information by the new scaling factor based to produce a second weighted accumulated reliability information, wherein the second weighted accumulated reliability information is combined with the reliability information from the target data storage unit to produce second combined reliability information.

In Example 23, the subject matter of Examples 19-22 can optionally include that the accumulating the reliability information comprises serially combining the reliability information from each of the storage units other than the target data storage unit with a stored previously accumulated reliability information, wherein the operations further comprise: during each serial iteration, storing a result of the serially combining the reliability information with the previously accumulated reliability information to use as the stored previously accumulated reliability information.

In Example 24, the subject matter of Examples 19-23 can optionally include that the combining comprises applying a soft XOR operation on the reliability information from one of the storage units other than the target data storage unit and the previously accumulated reliability information.

In Example 25, the subject matter of Examples 19-24 can optionally include that the first type decoding comprises applying a low-density parity-check ("LDPC") decoding to produce the reliability information output and wherein the second type decoding comprises a partial LDPC decoding performed by rerunning the LDPC decoding a partial number of decoding attempts to produce reliability information.

Example 26 is an apparatus for an error recovery operation for data in a target data storage unit comprising one of a plurality of data storage units storing codewords including data portions, wherein a parity storage unit has XOR parity data for error correction of the data portion in the data storage units, comprising: means for performing a decoding operation of the codeword in each of the storage units comprising the data storage units other than the target data storage unit and the parity storage unit to produce reliability information; means for obtaining reliability information for the data portion of the at least one additional failed storage unit in response to the decoding operation failing for at least one additional failed storage unit comprising the data and/or parity storage units other than the target data storage unit that failed to decode; and means for using the reliability information obtained from the storage units other than the target data storage unit to produce corrected data for the data unit in the target data storage unit.

In Example 27, the subject matter of Example 26 can optionally include that the decoding operation comprises a first type decoding operation, further comprising: accumulating in an accumulator the reliability information for the storage units other than the target data storage unit to use to produce accumulated reliability information; and performing a second type decoding operation for the data unit in the target data storage unit to produce reliability information; combining the accumulated reliability information from the accumulator with the reliability information from the target data storage unit to produce combined reliability information; and decoding the combined reliability information to produce the corrected data for the target data storage unit.

In Example 28, the subject matter of Examples 26-27 can optionally include that the weighting the accumulated reliability information by a scaling factor based on a number of decoding errors of the storage units other than the target data storage unit to produce weighted accumulated reliability information, wherein the weighted accumulated reliability information is combined with the reliability information from the target data storage unit to produce the combined reliability information.

In Example 29, the subject matter of Examples 26-28 can optionally include that the first type decoding comprises applying a low-density parity-check ("LDPC") decoding to produce the reliability information output and wherein the second type decoding comprises a partial LDPC decoding performed by rerunning the LDPC decoding a partial number of decoding attempts to produce reliability information.

Example 30 is a is a method for an error recovery operation for data in a target data storage unit comprising one of a plurality of data storage units storing codewords including data portions, wherein a parity storage unit has XOR parity data for error correction of the data portion in the data storage units, comprising: performing a decoding operation of the codeword in each of the storage units comprising the data storage units other than the target data storage unit and the parity storage unit to produce reliability information; in response to the decoding operation failing for at least one additional failed storage unit comprising the data and/or parity storage units other than the target data storage unit that failed to decode, obtaining reliability information for the data portion of the at least one additional failed storage unit; and using the reliability information obtained from the storage units other than the target data storage unit to produce corrected data for the data unit in the target data storage unit.

In Example 31, the subject matter of Example 30 can optionally include at least one step of: (1) wherein the data storage units and parity storage units each comprise NAND dies forming a solid state drive; (2) wherein the decoding operation comprises a first type decoding operation, and wherein the operations further comprise: accumulating in an accumulator the reliability information for the storage units other than the target data storage unit to use to produce accumulated reliability information; and performing a second type decoding operation for the data unit in the target data storage unit to produce reliability information; combining the accumulated reliability information from the accumulator with the reliability information from the target data storage unit to produce combined reliability information; and decoding the combined reliability information to produce the corrected data for the target data storage unit; (3) wherein the operations further comprise: weighting the accumulated reliability information by a scaling factor based on a number of decoding errors of the storage units other than the target data storage unit to produce weighted accumulated reliability information, wherein the weighted accumulated reliability information is combined with the reliability information from the target data storage unit to produce the combined reliability information; (4) wherein the weighted accumulated reliability information comprises a first weighted accumulated reliability information and wherein the combined reliability information comprises first combined reliability information, and wherein the operations further comprise: decoding the first combined reliability information to produce decoded data for the target data storage unit; in response to the decoded data not successfully decoding, determining a new scaling factor; and weighting the accumulated reliability information by the new scaling factor based to produce a second weighted accumulated reliability information, wherein the second weighted accumulated reliability information is combined with the reliability information from the target data storage unit to produce second combined reliability information; (5) wherein the accumulating the reliability information comprises serially combining the reliability information from each of the storage units other than the target data storage unit with a stored previously accumulated reliability information, wherein the operations further comprise: during each serial iteration, storing a result of the serially combining the reliability information with the previously accumulated reliability information to use as the stored previously accumulated reliability information; (6) wherein the combining comprises applying a soft XOR operation on the reliability information from one of the storage units other than the target data storage unit and the previously accumulated reliability information; (7) wherein the reliability information comprises Log-Likelihood Ratio (LLR) values; (8) wherein the first type decoding comprises applying a low-density parity-check ("LDPC") decoding to produce the reliability information output and wherein the second type decoding comprises a partial LDPC decoding performed by rerunning the LDPC decoding a partial number of decoding attempts to produce reliability information; and (9) wherein obtaining the reliability information when the decoding operation fails for the at least one additional failed storage unit comprises reading the reliability information from the storage unit being decoded.

Example 32 is an apparatus comprising means to perform a method as claimed in any preceding method claim.

Example 33 is a machine-readable storage including machine-readable instructions, when executed, to implement a method or realize an apparatus or system as described in any of the Examples 1-32.

What is claimed:

1. An apparatus comprising:
a plurality of data storage units to separately store a codeword that includes a data portion;
a parity storage unit to store a parity codeword that includes XOR parity data for error correction of the data portion in the data storage units; and
a controller coupled with the data storage units and the parity storage unit to perform an error recovery operation for a target data storage unit's data portion, the target data storage unit from among one of the data storage units; the controller including logic to:
    decode, via a first type decoding operation, the separately stored codewords at data storage units other than the target data storage unit and decode, via the first type decoding operation, the stored parity codeword at the parity storage unit to produce first reliability information;
    responsive to the first type decoding operation failing for at least one separately stored codeword in at least one failed data storage unit from among the data storage units other than the target data storage unit, obtain second reliability information for the failed storage unit's data portion;
    accumulate the first reliability information and the second reliability information to produce accumulated reliability information;
    decode, via a second type decoding operation, the target data storage unit's codeword to produce third reliability information;
    combine the accumulated reliability information with the third reliability information to produce combined reliability information; and
    decode, via a third type decoding operation, the combined reliability information to produce corrected data to recover the target data storage unit's data portion.

2. The apparatus of claim 1, the data storage units and parity storage units each comprise NAND dies included in a solid state drive.

3. The apparatus of claim 1, the first type decoding operation comprises a low-density parity-check ("LDPC") decoding to produce the first reliability information and the second type decoding operation comprises a partial LDPC decoding that reruns the LDPC decoding a partial number of decoding attempts to produce the second reliability information.

4. The apparatus of claim 3, the third type of decoding operation comprises an LDPC soft-decision decoding of the combined reliability information to produce the corrected data.

5. The apparatus of claim 1, the first reliability information comprises Log-Likelihood Ratio (LLR) values.

6. The apparatus of claim 1, comprising the logic to:
weight the accumulated reliability information by a scaling factor based on a number of decoding errors of the data storage units other than the target data storage unit to produce weighted accumulated reliability information, the weighted accumulated reliability information combined with the first reliability information to produce the combined reliability information.

7. The apparatus of claim 6, the weighted accumulated reliability information comprises a first weighted accumulated reliability information, the combined reliability information comprises first combined reliability information, and the logic to:
decode, via the third type decoding operation, the first combined reliability information to produce decoded data for the target data storage unit;
responsive to the decoded data not successfully decoding, determine a new scaling factor; and
weight the accumulated reliability information by the new scaling factor to produce a second weighted accumulated reliability information, the second weighted accumulated reliability information combined with the first reliability information to produce second combined reliability information.

8. The apparatus of claim 1, accumulate the first reliability information and the second reliability information comprises the logic to serially combine the second reliability information separately obtained from the at least one failed data storage unit with a stored previously accumulated reliability information, the logic further to:
store, during each serial iteration, a result of the serially combined second reliability information separately obtained from the at least one failed storage unit with the stored previously accumulated reliability information, the result to comprise the stored previously accumulated reliability information.

9. The apparatus of claim 1, the logic to combine the accumulated reliability information with the third reliability information comprises the logic to apply a soft XOR operation on the first reliability information and the accumulated reliability information to produce the combined reliability information.

10. The apparatus of claim 1, the data storage units and parity storage units each comprise non-volatile memory dies included in a solid state drive, wherein the non-volatile memory dies include NAND flash memory, ferroelectric random-access memory (Fe-TRAM), three-dimensional crosspoint memory that incorporates phase change memory, magnetoresistive random-access memory (MRAM) or spin transfer torque MRAM (STT-MRAM).

11. A method comprising:
recovering, via an error recovery operation, data in a target data storage unit from among a plurality of data storage units, the data storage units separately storing codewords including data portions and having a parity storage unit storing a parity codeword including XOR parity data for error correction of the data portion in the data storage units, the error recovery operation including:
  decoding, via a first type decoding operation, the separately stored codewords at data storage units other than the target data storage unit and decoding, via the first type of decoding operation, the stored parity codeword at the parity storage unit to produce first reliability information;
  responsive to the first type decoding operation failing for at least one separately stored codeword in at least one failed data storage unit from among the data storage units other than the target data storage unit, obtaining second reliability information for the failed storage unit's data portion;
  accumulating the first reliability information and the second reliability information to produce accumulated reliability information;
decoding, via a second type decoding operation, the target data storage unit's codeword to produce third reliability information;
combining the accumulated reliability information with the third reliability information to produce combined reliability information; and
  decoding, via a third type decoding operation, the combined reliability information to produce corrected data to recover the data in the target data storage unit.

12. The method of claim 11, the first type decoding operation comprises a low-density parity-check ("LDPC") decoding to produce the first reliability information and the second type decoding operation comprises a partial LDPC decoding that reruns the LDPC decoding a partial number of decoding attempts to produce the second reliability information.

13. The method of claim 12, the third type of decoding operation comprises an LDPC soft-decision decoding of the combined reliability information to produce the corrected data.

14. The method of claim 11, the first reliability information comprises Log-Likelihood Ratio (LLR) values.

15. The method of claim 11, comprising:
  weighting the accumulated reliability information by a scaling factor based on a number of decoding errors of the data storage units other than the target data storage unit to produce weighted accumulated reliability information, the weighted accumulated reliability information combined with the first reliability information to produce the combined reliability information.

16. The method of claim 15, the weighted accumulated reliability information comprises a first weighted accumulated reliability information, the combined reliability information comprises first combined reliability information, the method further comprising:
  decoding, via the third type decoding operation, the first combined reliability information to produce decoded data for the target data storage unit;
responsive to the decoded data not successfully decoding, determine a new scaling factor; and
  weighting the accumulated reliability information by the new scaling factor to produce a second weighted accumulated reliability information, the second weighted accumulated reliability information combined with the first reliability information to produce second combined reliability information.

17. The method of claim 11, accumulating the first reliability information and the second reliability information comprises:
  combining the second reliability information separately obtained from the at least one failed data storage unit with a stored previously accumulated reliability information; and
  storing, during each serial iteration, a result of the serially combined second reliability information separately obtained from the at least one failed storage unit with the stored previously accumulated reliability information, the result to comprise the stored previously accumulated reliability information.

18. The method of claim 11, combining the accumulated reliability information with the third reliability information comprises:
  applying a soft XOR operation on the first reliability information and the accumulated reliability information to produce the combined reliability information.

19. A system comprising:
  a processor;
  a storage device coupled with the processor, the storage device to include:
    a plurality of data storage units to separately store a codeword that includes a data portion;
    a parity storage unit to store a parity codeword that includes XOR parity data for error correction of the data portion in the data storage units; and
    a controller coupled with the data storage units and the parity storage unit to perform an error recovery operation for a target data storage unit's data portion, the target data storage unit from among one of the data storage units, the controller including logic to:
      decode, via a first type decoding operation, the separately stored codewords at data storage units other than the target data storage unit and decode, via the first type decoding operation, the stored parity codeword at the parity storage unit to produce first reliability information;
      responsive to the first type decoding operation failing for at least one separately stored codeword in at least one failed data storage unit from among the data storage units other than the target data storage unit, obtain second reliability information for the failed storage unit's data portion;
      accumulate the first reliability information and the second reliability information to produce accumulated reliability information;
      decode, via a second type decoding operation, the target data storage unit's codeword to produce third reliability information;
      combine the accumulated reliability information with the third reliability information to produce combined reliability information; and
      decode, via a third type decoding operation, the combined reliability information to produce corrected data to recover the target data storage unit's data portion.

20. The system of claim 19, the first type decoding operation comprises a low-density parity-check ("LDPC") decoding to produce the first reliability information and the second type decoding operation comprises a partial LDPC decoding that reruns the LDPC decoding a partial number of decoding attempts to produce the second reliability information.

21. The system of claim 19, the third type of decoding operation comprises an LDPC soft-decision decoding of the combined reliability information to produce the corrected data.

22. The system of claim 19, the first reliability information comprises Log-Likelihood Ratio (LLR) values.

23. The system of claim 19, comprising the logic to:
weight the accumulated reliability information by a scaling factor based on a number of decoding errors of the data storage units other than the target data storage unit to produce weighted accumulated reliability information, the weighted accumulated reliability information combined with the first reliability information to produce the combined reliability information.

24. The system of claim 23, the weighted accumulated reliability information comprises a first weighted accumulated reliability information, the combined reliability information comprises first combined reliability information, and the logic to:
decode, via the third type decoding operation, the first combined reliability information to produce decoded data for the target data storage unit;
responsive to the decoded data not successfully decoding, determine a new scaling factor; and
weight the accumulated reliability information by the new scaling factor to produce a second weighted accumulated reliability information, the second weighted accumulated reliability information combined with the first reliability information to produce second combined reliability information.

25. The system of claim 19, accumulate the first reliability information and the second reliability information comprises the logic to serially combine the second reliability information separately obtained from the at least one failed data storage unit with a stored previously accumulated reliability information, the logic further to:
store, during each serial iteration, a result of the serially combined second reliability information separately obtained from the at least one failed storage unit with the stored previously accumulated reliability information, the result to comprise the stored previously accumulated reliability information.

26. The system of claim 19, the logic to combine the accumulated reliability information with the third reliability information comprises the logic to apply a soft XOR operation on the first reliability information and the accumulated reliability information to produce the combined reliability information.

27. The system of claim 19, the data storage units and parity storage unit each comprise non-volatile memory dies included in a solid state drive, wherein the non-volatile memory dies include NAND flash memory, ferroelectric random-access memory (Fe-TRAM), three-dimensional crosspoint memory that incorporates phase change memory, magnetoresistive random-access memory (MRAM) or spin transfer torque MRAM (STT-MRAM).

28. The system of claim 19, comprising a network interface coupled with the processor.

* * * * *